(12) United States Patent
Wang et al.

(10) Patent No.: US 10,712,380 B2
(45) Date of Patent: Jul. 14, 2020

(54) METHODS AND APPARATUS FOR ELECTRO-STATIC DISCHARGE PATH DETECTION

(71) Applicants: Semiconductor Manufacturing International (Shanghai) Corporation, Shanghai (CN); Semiconductor Manufacturing International (Beijing) Corporation, Beijing (CN)

(72) Inventors: Jun Wang, Shanghai (CN); Gang Ning Wang, Shanghai (CN); Mi Tang, Shanghai (CN); Xian Yong Pu, Shanghai (CN); Chengyu Zhu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 106 days.

(21) Appl. No.: 16/000,332

(22) Filed: Jun. 5, 2018

(65) Prior Publication Data

US 2018/0348279 A1 Dec. 6, 2018

(30) Foreign Application Priority Data

Jun. 6, 2017 (CN) .......................... 2017 1 0417816

(51) Int. Cl.
*G01R 31/00* (2006.01)
*G06T 7/00* (2017.01)
*H01L 21/66* (2006.01)
*H01L 27/02* (2006.01)

(52) U.S. Cl.
CPC ............ *G01R 31/002* (2013.01); *G06T 7/001* (2013.01); *H01L 22/12* (2013.01); *G06T 2207/30148* (2013.01); *H01L 22/14* (2013.01); *H01L 27/0248* (2013.01)

(58) Field of Classification Search
None
See application file for complete search history.

(56) References Cited

U.S. PATENT DOCUMENTS

| | | | |
|---|---|---|---|
| 6,801,046 B1 * | 10/2004 | Gao | G01R 31/311 324/754.23 |
| 6,891,363 B2 * | 5/2005 | Desplats | G01R 31/2656 324/762.09 |
| 10,012,688 B2 * | 7/2018 | Ohtsuka | G01R 31/001 |
| 2007/0007545 A1 * | 1/2007 | Salcedo | H01L 27/0262 257/127 |
| 2010/0117674 A1 * | 5/2010 | Hernandez | G01R 31/002 324/754.22 |

* cited by examiner

*Primary Examiner* — Douglas X Rodriguez
(74) *Attorney, Agent, or Firm* — Anova Law Group, PLLC

(57) ABSTRACT

A method for fabricating a semiconductor structure includes when a chip under test releases an ESD current, detecting position information of photons emitted from the chip under test due to releasing of the ESD current; acquiring an image of an ESD path based on the detected position information of the photons; and determining whether the ESD path corresponding to the chip under test is normal based on the image of the ESD path and a layout image of the chip under test.

17 Claims, 4 Drawing Sheets

METHODS AND APPARATUS FOR ELECTRO-STATIC DISCHARGE PATH DETECTION

CROSS-REFERENCES TO RELATED APPLICATIONS

This application claims the priority of Chinese Patent Application No. CN201710417816.8, filed on Jun. 6, 2017, the entire content of which is incorporated herein by reference.

FIELD OF THE DISCLOSURE

The present disclosure generally relates to the field of electric circuit technology and, more particularly, relates to methods and apparatus for electro-static discharge (ESD) path detection.

BACKGROUND

In electro-static discharge (ESD) circuits, a desirable design for ESD releasing path can make the ESD circuit flow along a predetermined path such that the safety and the reliability of the operation of the chip are ensured. During a design of the ESD path, transmission line pulse (TLP) data of the chip may be obtained first, and the obtained TLP data may then be used to analyze the ESD path in the chip.

In the case that the analysis result, based on the TLP data of the chip, of the ESD path is inconsistent with the expectation, it is difficult to position an abnormal ESD path within the chip. Therefore, analyzing the ESD path in the chip based on the TLP data may not meet the requirements for analyzing the cause of the ESD path failure in the chip.

For example, when the result of the ESD path obtained by analyzing the TLP data is inconsistent with the expectation, the analysis of the TLP data may only be able to provide one electrical parameter, i.e., the corresponding sustaining point. Because various electrical structures can generate a same sustaining point, it is difficult to precisely determine which electrical structure generates the sustaining point. Therefore, the position of the abnormal ESD path may not be precisely determined. As a result, subsequent analysis of the ESD path failure in the chip cannot be processed.

The disclosed ESD path detection methods and apparatus thereof are directed to solve one or more problems set forth above and other problems in the art.

BRIEF SUMMARY OF THE DISCLOSURE

One aspect of the present disclosure provides an electro-static discharge (ESD) path detection method. The ESD path detection method includes when a chip under test releases an ESD current, detecting position information of photons emitted from the chip under test due to releasing of the ESD current; acquiring an image of an ESD path based on the detected position information of the photons; and determining whether the ESD path corresponding to the chip under test is normal based on the image of the ESD path and a layout image of the chip under test.

Another aspect of the present disclosure provides an ESD path detection apparatus. The ESD path detection apparatus includes a detector, configured to, when a chip under test releases an ESD current, detect position information of photons emitted from the chip under test due to releasing of the ESD current; an image generator, configured to generate an image of an ESD path based on the detected position information of the photons; and a path determination unit, configured to determine whether the ESD path corresponding to the chip under test is normal based on the image of the ESD path and a layout image of the chip under test.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The present disclosure provides an ESD path detection method and an ESD path detection apparatus. As disclosed, when a chip under test releases an ESD current, the position information of the photons emitted from the chip under test due to releasing of the ESD current may be detected. Moreover, an ESD path image may then be obtained based on the detected position information of the photons. Further, based on the ESD path image, whether the ESD path corresponding to the chip under test is normal may be determined. As such, the disclosed method and apparatus may meet the requirements for analyzing the cause of the ESD path failure in the chip.

Figure 1:
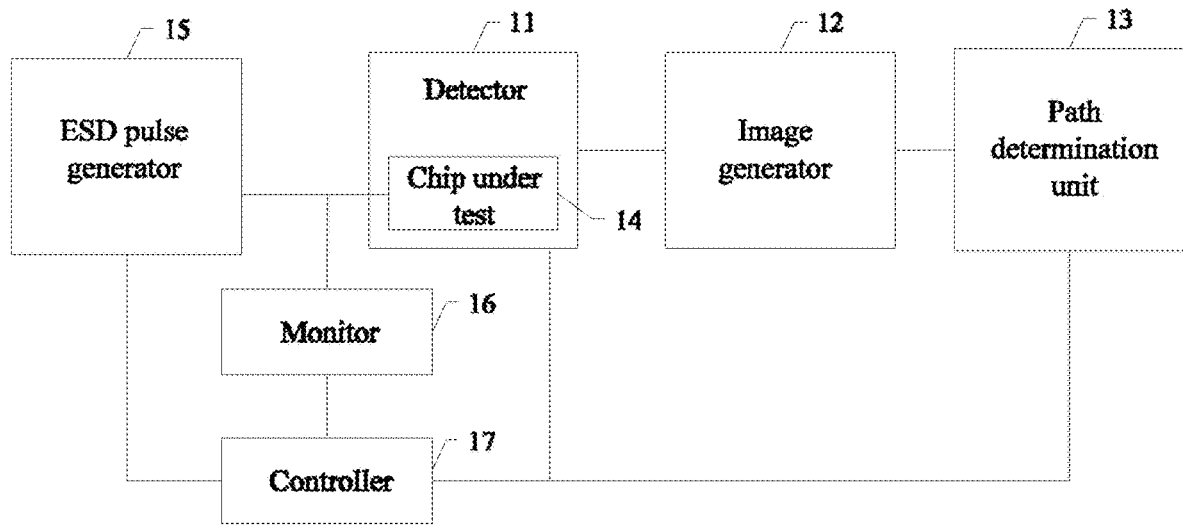
FIG. 1 illustrates a schematic structural view of an exemplary ESD path detection apparatus consistent with various embodiments of the present disclosure.

FIG. 1 illustrates a schematic structural view of an exemplary ESD path detection apparatus consistent with various embodiments of the present disclosure. Referring to FIG. 1, in one embodiment, the ESD path detection apparatus may include a detector 11, an image generator 12, and a path determination unit 13. The detector 11, the image generator 12, and the path determination unit 13 may be coupled to each other.

The detector 11 may be configured to, when a chip under test 14 releases an ESD current, detect the position information of the photons emitted from the chip under test 14 due to releasing of the ESD current.

The image generator 12 may be configured to obtain an ESD path image based on the detected position information of the photons.

The path determination unit 13 may be configured to determine whether the ESD path that corresponds to the chip under test 14 is normal based on the ESD path image.

In one embodiment, the ESD path detection apparatus may also include an ESD pulse generator 15. The ESD pulse generator 15 may be configured to drive the chip under test 14 to release an ESD current by applying ESD pulses to the chip under test 14.

In one embodiment, in order to ensure that the pulses generated by the ESD pulse generator 15 can be applied to the chip under test 14 effectively, the ESD pulse generator 15 and the chip under test 14 may be connected using wires matched in both capacitance and impedance. That is, the capacitance and impedance of the wires used to connect the ESD pulse generator 15 and the chip under test 14 may match with the output impedance of the ESD pulse generator 15. As such, transmission attenuation of the ESD pulse generated by the ESD pulse generator 15 may be avoided, and thus the ESD pulse applied to the chip under test 14 and the ESD pulse generated by the ESD pulse generator 15 may be kept as consistent as possible to avoid affecting the detection result.

In one embodiment, the ESD pulse generator 15 may generate ESD pulses at predetermined time intervals and apply the ESD pulses to the chip under test 14. The predetermined time intervals may be set according to the actual needs. Moreover, in some embodiments, the time intervals between neighboring ESD pulses may have a same value; that is, the ESD pulse generator 15 may generate ESD pulses at a constant time interval. In some other embodiments, the time intervals between neighboring ESD pulses may have different values.

In one embodiment, in order to ensure that the device structures on the substrate of the chip under test 14, such as bipolar junction transistors (BJTs), silicon-controlled rectifiers (SCRs), etc., can stably emit photons, the ESD pulse generator 15 may repeatedly generate ESD pulses and apply the ESD pulses to the chip under test 14 at a constant time interval. For example, the ESD pulse generator 15 generates ESD pulses and applies the ESD pulses to the chip under test 14 at a time interval less than 0.1 second. As such, the energy of the pluses applied to the chip under test 14 each time may be stable, which may improve the consistency and the accuracy of the detection result.

In one embodiment, the waveform of the pulses generated by the ESD pulse generator 15 may be set according to the actual needs. For example, the waveform of the pulses may be set according to a human body model (HBM), a machine model (MM), etc. For example, the discharge waveform according to the HBM may be used to characterize the pulse waveform when human body contacts the device; the discharge waveform according to the MM may be used to characterize the waveform of small resistance discharge. It should be understood that the ESD pulses generated by the ESD pulse generator 15 may have any other appropriate ESD waveform, such as the discharge waveform according to a furniture model, etc.

In one embodiment, in order to ensure that the waveform of the pulses generated by the ESD pulse generator 15 is consistent with the preset pulse waveform, the ESD path detection apparatus may also include a monitor 16. By using the monitor 16 to monitor the pulses generated by the ESD pulse generator 15 may help the calibration of the pulses generated by the ESD pulse generator 15.

In one embodiment, the monitor 16 may be an oscillographic unit. The oscillographic unit may include an oscilloscope. For example, an oscilloscope with a bandwidth above 500 MHz may be coupled to the ESD pulse generator 15. The oscilloscope may be used to capture and display the ESD pulses applied to the chip under test 14 such that the waveform of the ESD pluses generated by the ESD pulse generator 15 can be calibrated. As such, the waveform of the ESD pulses applied to the chip under test 14 may be kept to be consistent with the preset waveform, which may further improve the accuracy of the detection result.

In one embodiment, the ESD path in the chip under test 14 may generate an ESD current each time when an ESD pulse is received. When the generated ESD current flows through a device on the chip under test 14, such as a BJT, a SCR, etc., band-hopping in the structure of the device on the chip under test 14 may be induced, and thus photons may be emitted. Therefore, when the ESD pulse generator 15 generates ESD pulses at a predetermined time interval, energy can be released repeatedly and continuously such that the detector 11 may be able to detect the position information of the photons emitted from the chip under test 14 due to releasing of the ESD current.

In one embodiment, the detector 11 may be an emission microscope (EMMI), or an InGaAs detector. In other embodiments, the detector may be any other detective devices capable of detecting the position information of the photons emitted from the chip under test 14 due to releasing of the ESD current.

In one embodiment, the photons emitted from the chip under test 14 due to releasing the ESD current may generate a glimmer. The position of the glimmer may be the position of the emitted photons. Accordingly, under the application of continuous ESD pulses, photons continuously emitted from the chip under test 14 may form an optical path. The optical path may represent an ESD path of the chip under test 14. Therefore, the image generator 12 may be able to obtain an ESD path image of the chip under test 14 based on the detected position information of the photons. Further, from the ESD path image, the position of the ESD path with respect to the chip under test 14 may be viewed.

In one embodiment, after obtaining the ESD path image, the path determination unit 13 may place the ESD path image to overlap with the layout image of the chip under test 14 for position comparison. When the position of the ESD path in the ESD path image is the same as the position of the corresponding ESD path in the layout image of the chip under test 14, the corresponding ESD path in the chip under test 14 may be a normal ESD path; otherwise, the corresponding ESD path in the chip under test 14 may be an abnormal ESD path. Based on the output of the path determination unit 13, the cause of the ESD path failure in the chip under test 14 may be further analyzed to promptly solve the ESD path failure problem in the chip under test 14.

In one embodiment, the ESD path detection apparatus may also include a controller 17. The controller 17 may be coupled to the detector 11, the monitor 16, and the ESD pulse generator 15. The controller 17 may be configured to control the detector 11, the monitor 16, and the ESD pulse generator 15 to be turned on or turned off simultaneously such that consistency of the detection result may be ensured.

For example, the controller 17 may control the ESD pulse generator 15 to repeatedly generate ESD pulses and apply the generated ESD pulses to the chip under test 14 in a time period. In the meantime, the monitor 16 may be controlled to monitor the ESD pulses generated by the ESD pulse generator 15 during the same time period, and the detector 11 may be controlled to detect the photons emitted from the chip under test 14 in the same time period such that the consistency of the detection result may be ultimately ensured.

Figure 2:
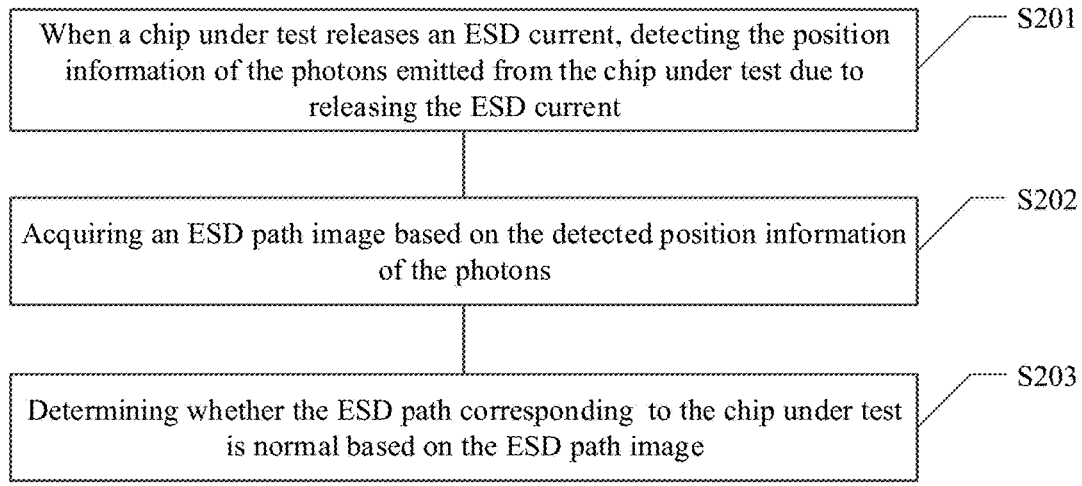
FIG. 2 illustrates a schematic flowchart of an exemplary ESD path detection apparatus consistent with various embodiments of the present disclosure.

Further, the present disclosure also provides an ESD path detection method corresponding to the disclosed ESD path detection apparatus. FIG. 2 illustrates a schematic flowchart of an exemplary ESD path detection apparatus consistent with various embodiments of the present disclosure.

Referring to FIG. 2, the ESD path detection method may be suitable for detecting the ESD path in a chip under test. The ESD path detection method may include the following exemplary steps.

In Step S201, when a chip under test releases an ESD current, the position information of the photons emitted during the chip under test releasing the ESD current may be detected.

In one embodiment, ESD pluses may be applied to the chip under test at predetermined time intervals to drive the chip under test to release ESD currents. When the ESD pulses are applied to the chip under test, the time intervals between adjacent ESD pulses are not limited to certain values.

In one embodiment, in order to ensure that the device structures on the substrate of the chip under test can stably emit photons, ESD pulses may be repeatedly generated and applied to the chip under test at a constant time interval. As such, the stability of the energy of the pluses applied to the chip under test each time may be ensured, which may improve the consistency and the accuracy of the detection result.

In one embodiment, in order to further ensure the consistency of the detection capability, the ESD path detection method may also include monitoring the ESD pulses applied to the chip under test. By monitoring the pulses applied to the chip under test, it may be convenient to calibrate the pulses applied to the chip under test, and thus ensure that the waveform of the pluses applied to the chip under test is consistent with the waveform of the preset pulse.

In Step S202, based on the detected position information of the photons, the ESD path image may be obtained.

In one embodiment, the photons emitted from the chip under test due to releasing the ESD current may generate a glimmer. The position of the glimmer may be the position of the emitted photons. Accordingly, under the application of continuous ESD pulses, photons continuously emitted from the chip under test may form an optical path. At this time, based on the detected position information of the photons, the ESD path image may be obtained.

In Step S203, based on the ESD path image, whether the ESD path that corresponds to the chip under test is normal or not may be determined.

In one embodiment, after obtaining the ESD path image, the ESD path image may be placed to overlap with the layout image of the chip under test for position comparison. When the position of the ESD path in the ESD image is the same as the position of the corresponding ESD path in the layout image of the chip under test, the corresponding ESD path in the chip under test may be a normal ESD path; otherwise, the corresponding ESD path in the chip under test may be an abnormal ESD path.

In the following, a detailed description accompanied by reference drawings FIGS. 3-7 is provided to illustrate how to determine the position of the normal ESD path and the abnormal ESD path in the chip under test based on the ESD path image.

Figure 3:
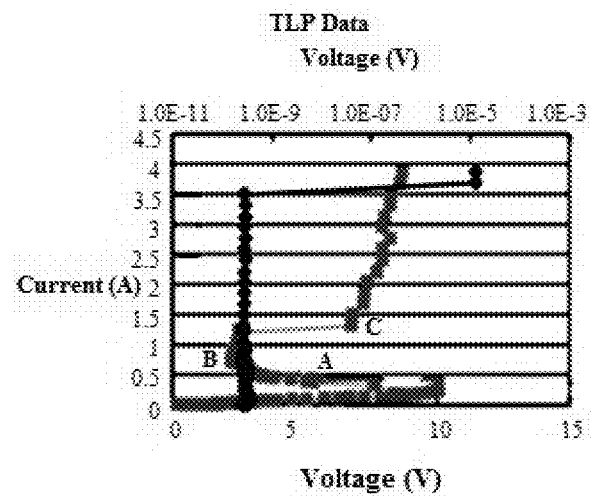
FIG. 3 illustrates curves of the transmission line pulse (TLP) data corresponding to a chip under test.

FIG. 3 illustrates curves of the TLP data corresponding to a chip under test. In the TLP data shown in FIG. 3, the TLP data corresponding to the chip under test is inconsistent with the expectation, and abrupt changes in the current occur at three points, i.e., point A, point B, and point C. Because point A, point B, and point C are located at three straight lines with different slops, the analysis may thus indicate that the chip under test contains three ESD paths. Based on the TLP data analysis result of the chip under test, corresponding ESD pulses with different pulse voltages may be applied to the pulse-input pins of the chip under test to obtain different ESD paths of the chip under test.

Figure 4:
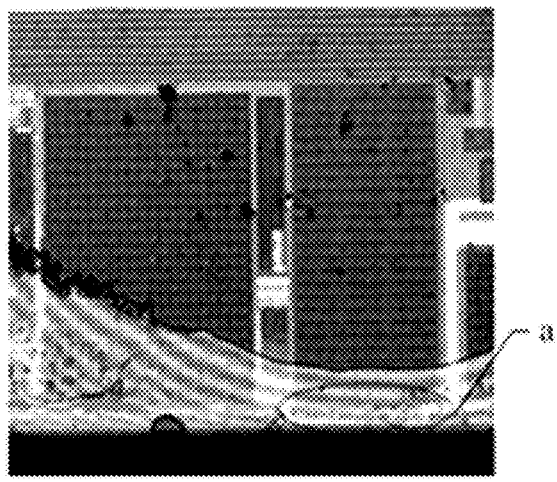
FIG. 4 illustrates an ESD path image of a chip under test in response to HBM-200V input pulses according to an embodiment of the present disclosure.
Figure 5:
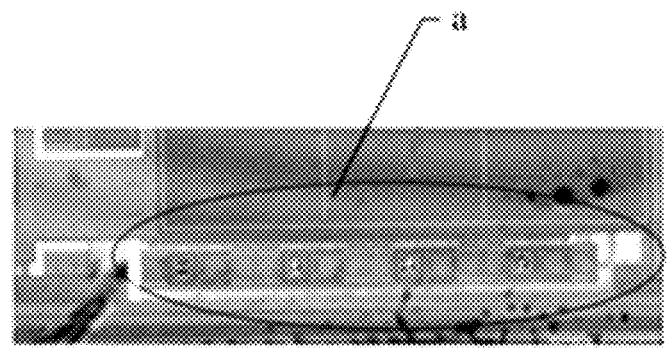
FIG. 5 illustrates an enlarged partial view of the ESD path image shown in FIG. 4.

FIG. 4 illustrates an ESD path image of the chip under test in response to HBM-200V input pulses according to an embodiment of the present disclosure, and FIG. 5 illustrates an enlarged partial view of the ESD path image shown in FIG. 4. Referring to FIGS. 4-5, by sending HBM-200V ESD pulses into the pulse-input pins of the chip under test, the ESD path image corresponding to point A in FIG. 3 may be obtained. Region a shown in FIG. 4 indicates the ESD path image corresponding to point A shown in FIG. 3. In the ESD path image shown in FIG. 4, the photon energy may be released in region a. That is, the current ESD path of the chip under test is located in region a. FIG. 5 shows an enlarged view of region a. By placing region a of the ESD path image shown in FIG. 4 to overlap with the corresponding region in the layout image of the chip under test, whether the ESD path corresponding to region a is a normal ESD path may be determined.

Figure 6:
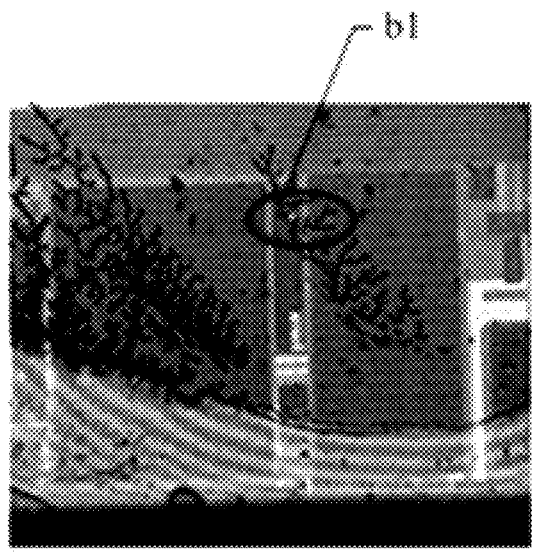
FIG. 6 illustrates an ESD path image of a chip under test in response to HBM-500V input pulses according to an embodiment of the present disclosure.
Figure 7:
FIG. 7 illustrates a layout image of the chip under test in response to FIG. 6.

FIG. 6 illustrates an ESD path image of the chip under test in response to HBM-500V input pulses according to an embodiment of the present disclosure. FIG. 7 illustrates a layout image of the chip under test corresponding to FIG. 6. Referring to FIG. 6, by sending HBM-500V ESD pulses into the pulse-input pins of the chip under test, the ESD path image corresponding to point B in FIG. 3 may be obtained. Region b1 shown in FIG. 6 indicates the ESD path image corresponding to point B shown in FIG. 3. In the ESD path image shown in FIG. 6, the photon energy may be released in region b1. That is, the current ESD path of the chip under test is located in region b1. By placing region b1 of the ESD path image shown in FIG. 6 to overlap with the corresponding region, e.g. region b2, in the layout image of the chip under test as shown in FIG. 7, whether the ESD path corresponding to region b1 is a normal ESD path may be determined.

Figure 8:
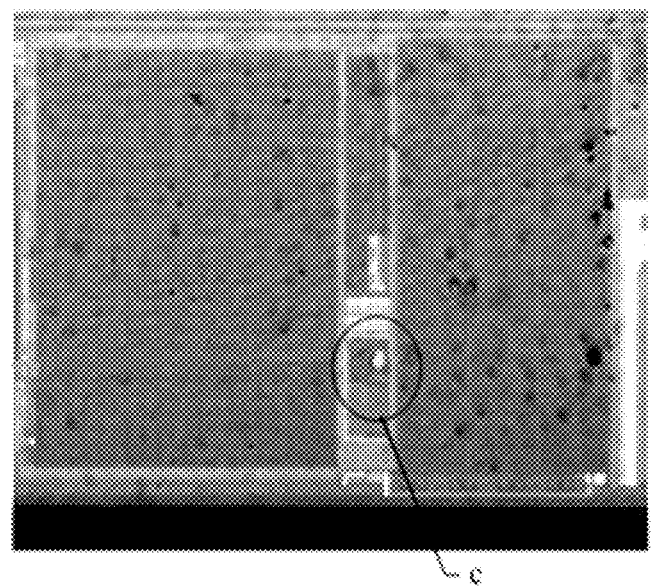
FIG. 8 illustrates an ESD path image of a chip under test in response to HBM-2000V input pulses according to an embodiment of the present disclosure.

FIG. 8 illustrates an ESD path image of the chip under test in response to HBM-2000V input pulses according to an embodiment of the present disclosure. Referring to FIG. 8, by sending HBM-2000V ESD pulses into the pulse-input pins of the chip under test, the ESD path image corresponding to point C in FIG. 3 may be obtained. Region c in FIG. 8 indicates the ESD path image corresponding to point C shown in FIG. 3. In the ESD path image shown in FIG. 8, the photon energy may be released in region c. That is, the current ESD path of the chip under test is located in region c. By placing region c of the ESD path image shown in FIG. 8 to overlap with the corresponding region in the layout image of the chip under test, whether the ESD path corresponding to region c is a normal ESD path may be determined.

Therefore, according to the methods described above in the various embodiments of the present disclosure, when a chip under test releases an ESD current, the position information of the photons emitted from a chip under test due to releasing the ESD current may be detected; the ESD path image may be obtained based on the detected position information of the photons; and whether the ESD path that corresponds to the chip under test is a normal ESD path may thus be determined based on the ESD path image. As such, the disclosed methods may meet the requirements for analyzing the cause of the ESD path failure in the chip under test.

Those ordinary skilled in the art should understand that all or part of the steps in the methods described above according to various embodiments of the present disclosure may be implemented by relevant hardware instructed by a program. The program may be stored in a computer-readable storage medium, and the storage medium may include read-only memory (ROM), random-access memory (RAM), magnetic disc, optical disc, or any other appropriate storage medium.

In some embodiments, a computing device, for example, at least including a memory and a processor, may be incorporated with the disclosed apparatus to implement one or more exemplary steps of the disclosed method. The memory may be used to store program instructions. When the program instructions being executed, the processor may be configured to implement the one or more exemplary steps of the disclosed method.

Compared to conventional ESD path detection methods and apparatus, the disclosed ESD path detection methods and apparatus may demonstrate advantages as follows.

According to the disclosed methods and apparatus, when a chip under test releases an ESD current, the position information of the photons emitted from a chip under test due to releasing the ESD current may be detected; then, the ESD path image may be obtained based on the detected position information of the photons; further, whether the ESD path that corresponds to the chip under test is a normal ESD path may be determined based on the ESD path image. As such, the disclosed methods and apparatus may meet the requirements for analyzing the cause of the ESD path failure in the chip under test.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for detecting an electro-static discharge (ESD) path, comprising:
applying ESD pulses to a chip under test to drive the chip under test to release an ESD current;
when the chip under test releases the ESD current, detecting position information of photons emitted from the chip under test due to releasing of the ESD current;
acquiring an image of an ESD path based on the detected position information of the photons; and
determining whether the ESD path corresponding to the chip under test is normal based on the image of the ESD path and a layout image of the chip under test, wherein determining whether the ESD path corresponding to the chip under test is normal includes:
placing the image of the ESD path to overlap with the layout image of the chip under test for a position comparison; and
when a position of the image of the ESD path is identical to a position of a corresponding ESD path in the layout image of the chip under test, determining the corresponding ESD path in the chip under test as a normal ESD path; otherwise, determining the corresponding ESD path in the chip under test as an abnormal ESD path.

2. The method according to claim 1, wherein:
the ESD pulses applied to the chip under test are generated at predetermined time intervals.

3. The method according to claim 2, wherein:
the predetermined time intervals include a constant time interval.

4. The method according to claim 1, further including:
monitoring the ESD pulses applied to the chip under test.

5. The method according to claim 1, wherein:
the ESD current induces band-hopping in the chip under test to emit the photons.

6. The method according to claim 1, wherein:
an optical path is formed by the photons when the ESD pulses are applied to the chip under test continuously.

7. An ESD path detection apparatus, comprising:
an ESD pulse generator, configured to drive a chip under test to release an ESD current by applying ESD pulses to the chip under test;
a detector, configured to, when the chip under test releases the ESD current, detect position information of photons emitted from the chip under test due to releasing of the ESD current;
an image generator, configured to generate an image of an ESD path based on the detected position information of the photons; and
a path determination unit, configured to determine whether the ESD path corresponding to the chip under test is normal based on the image of the ESD path and a layout image of the chip under test, wherein the path determination unit is configured to:
place the image of the ESD path to overlap with the layout image of the chip under test for a position comparison; and
when a position of the image of the ESD path is identical to a position of a corresponding ESD path in the layout image of the chip under test, determine the corresponding ESD path in the chip under test as a normal ESD path; otherwise, determine the corresponding ESD path in the chip under test as an abnormal ESD path.

8. The apparatus according to claim 7, wherein:
the ESD pulse generator is configured to generate the ESD pulses at predetermined time intervals and apply the ESD pulses to the chip under test.

9. The ESD path detection apparatus according to claim 8, wherein:
the predetermined time intervals include a constant time interval.

10. The apparatus according to claim 8, wherein:
the ESD pulse generator is coupled to the chip under test using wires with capacitance and impedance matching with output impedance of the ESD pulse generator.

11. The apparatus according to claim 8, wherein:
the ESD pulse generator generates ESD pulses using a human body model (HBM) or a machine model (MM).

12. The apparatus according to claim 8, further including:
a monitor, configured to monitor the ESD pulses applied to the chip under test.

13. The apparatus according to claim 12, wherein:
the monitor includes an oscilloscope.

14. The apparatus according to claim 12, further including:

a controller, configured to control the detector, the monitor, and the ESD pulse generation to be turned on or turned off simultaneously.

15. The apparatus according to claim 7, wherein:
the detector is an emission microscope (EMMI) or an InGaAs detector.

16. The apparatus according to claim 7, wherein:
the ESD current induces band-hopping in the chip under test to emit the photons.

17. The apparatus according to claim 7, wherein:
an optical path is formed by the photons when the ESD pulses are applied to the chip under test continuously.

* * * * *